United States Patent [19]

Kahng et al.

[11] Patent Number: 4,950,616

[45] Date of Patent: Aug. 21, 1990

[54] METHOD FOR FABRICATING A BICMOS DEVICE

[75] Inventors: Chang-Won Kahng, Seoul; Sung-Ki Min, Incheon; Jong-Mil Youn, Seoul, all of Rep. of Korea

[73] Assignee: Samsung Electronics Co., Ltd., Rep. of Korea

[21] Appl. No.: 353,105

[22] Filed: May 17, 1989

[30] Foreign Application Priority Data

Jul. 13, 1988 [KR] Rep. of Korea ................ 888698

[51] Int. Cl.$^5$ ............... H01L 21/00; H01L 21/02; H01L 21/22; H01L 21/263
[52] U.S. Cl. ............... 437/31; 437/33; 437/34; 437/51; 437/56; 148/DIG. 9; 357/42; 357/43; 156/657; 156/662
[58] Field of Search ............... 437/31, 33, 34, 51, 437/56, 83, 84; 148/DIG. 9; 156/643, 657, 662; 357/40, 42, 43

[56] References Cited

U.S. PATENT DOCUMENTS

| | | | |
|---|---|---|---|
| 4,346,513 | 8/1982 | Nishizawa et al. | 437/105 |
| 4,425,516 | 1/1984 | Wanlass | 307/475 |
| 4,475,279 | 10/1984 | Gahle | 437/31 |
| 4,536,945 | 8/1985 | Gray et al. | 437/98 |
| 4,628,341 | 12/1986 | Thomas | 148/DIG. 9 |
| 4,717,680 | 1/1988 | Piotrowski | 437/31 |
| 4,727,046 | 2/1988 | Tuntasood et al. | 437/57 |
| 4,734,382 | 3/1988 | Krishna | 437/163 |

FOREIGN PATENT DOCUMENTS

| | | | |
|---|---|---|---|
| 0047493 | 4/1979 | Japan | 437/51 |
| 0149163 | 7/1987 | Japan | 437/51 |
| 0154779 | 7/1987 | Japan | 357/43 |
| 0067776 | 3/1988 | Japan | 437/51 |
| 2143086A | 1/1985 | United Kingdom | 437/34 |
| 2188479A | 9/1987 | United Kingdom | 437/31 |

*Primary Examiner*—Brian E. Hearn
*Assistant Examiner*—B. Everhart
*Attorney, Agent, or Firm*—Ladas & Parry

[57] ABSTRACT

This invention provides a method for fabricating a semiconductor device comprising the steps of forming buried layers on the silicon substrate; etching an epitaxial layer after said layer is grown up, the step further including the processes of etching selectively the silicon epitaxial layer of well region on which a high speed bipolar transistor is formed to be thin and keeping the silicon epitaxial layer of well region on which nMOS transistor is formed remained the same thickness as grown up; and forming a pMOS transistor, a nMOS transistor and a bipolar transistor. High efficiency and high integration is easily attained in fabricating the high speed bipolar transistor and high performance CMOS transistor on same chip and by reducing the difficulty in processing according to the method of present invention.

2 Claims, 3 Drawing Sheets

METHOD FOR FABRICATING A BICMOS DEVICE

BACKGROUND OF THE INVENTION

This invention relates to a method for fabricating a semiconductor device in which bipolar, n-MOS, p-MOS transistors are integrated.

In conventional method, the buried layers are formed on the substrate, the single crystalline silicon epitaxial layer of proper thickness is grown on the buried layers, the twin well is formed, and then bipolar, n-MOS, p-MOS, transistors are formed by the conventional method to fabricate these devices in one chip.

But this structure has the disadvantages for high performance and high speed BiCMOS semiconductor IC's. Firstly, it is very difficult to grow the thin epitaxial layer without serious crystal defects and have a sufficiently reproducible epitaxial layer in mass production. Secondly, a thin epitaxial layer is needed for high speed bipolar transistors and a fairly thick epitaxial layer for high performance MOS transistor.

SUMMARY OF THE INVENTION

It is an object to provide a method for fabricating a semiconductor device of the high speed, high performance and high integration density devices on one chip through the needfulness of each devices.

According to the present invention, there is provided a method for fabricating a semiconductor device of forming buried layers on the silicon substrate; etching an epitaxial after said layer is grown up, the step further including the process of etching selectively the silicon epitaxial layer of well region on which a high speed bipolar transistor is formed to be thin and keeping the silicon epitaxial layer of well region on which nMOS transistor is formed remained the same thickness as grown up; and forming a pMOS transistor, a nMOS transistor and a bipolar transistor.

DETAILED DESCRIPTION OF THE INVENTION

Figure 1A:
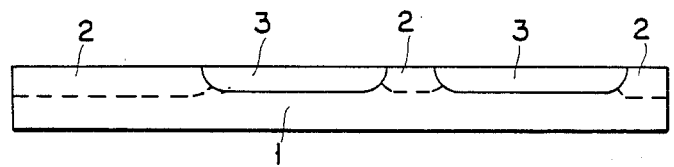
FIGS. 1(A)–1(I) are a schematic cross-sectional view of the fabrication process of the invention.
Figure 1B:
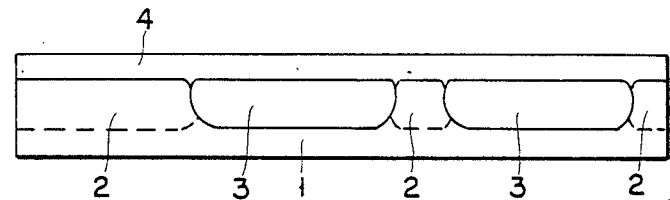
Figure 1C:
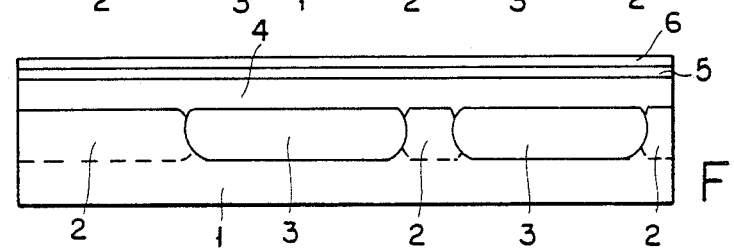
Figure 1D:
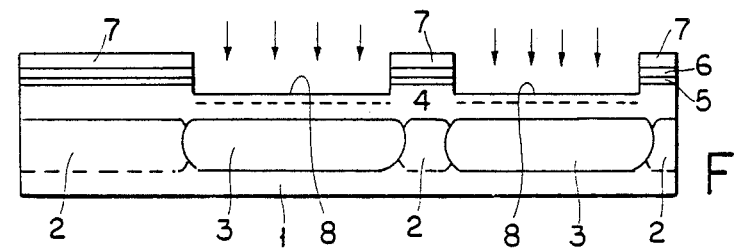
Figure 1E:
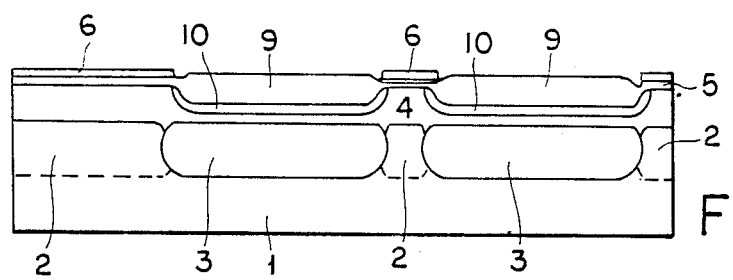
Figure 1F:
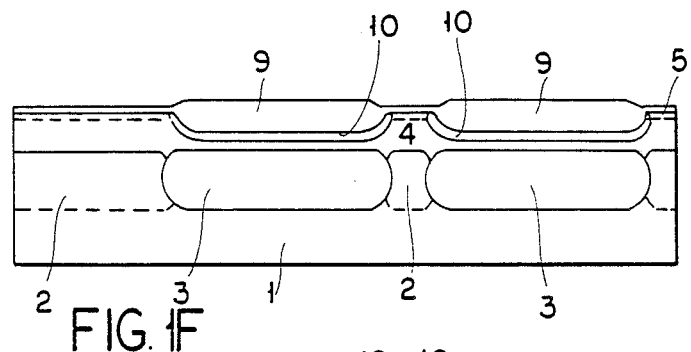
Figure 1G:
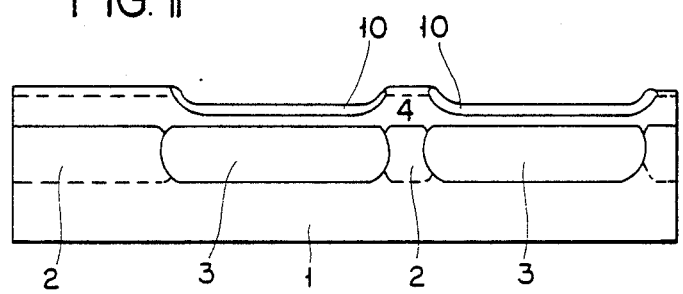
Figure 1H:
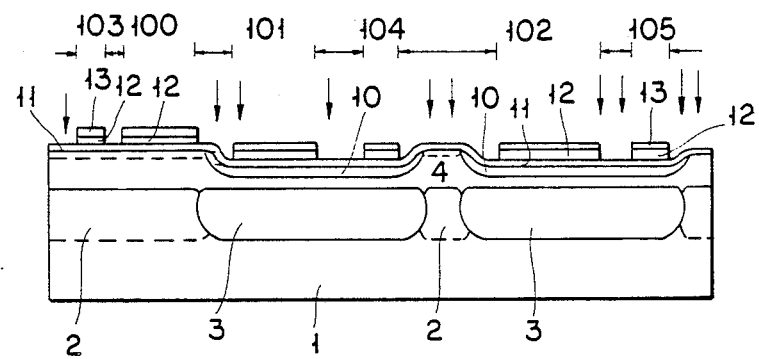
Figure 1I:
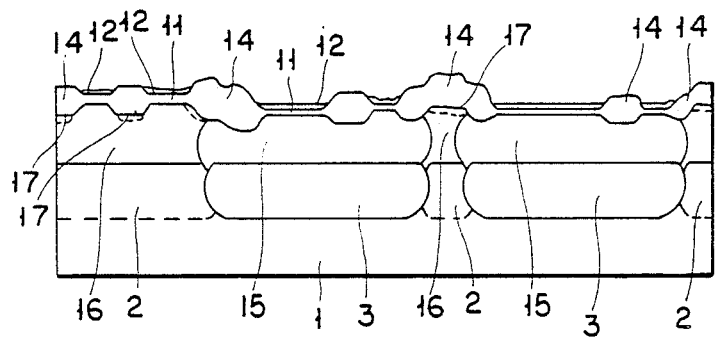

FIG. 1A, FIG. 1B and FIG. 1C are the process to grow the epitaxial layer 4 on the silicon substrate 1 which has twin buried layer 2, 3. FIG. 1D is the photolithographic process to define the n-type well and FIG. 1E is the n-type well formation process by the ion implantation. FIG. 1F and FIG. 1G are the etching and ion implantation process for the p-type well. FIG. 1H is the oxide film growth for the device isolation throught the ion implantation in a confined region. FIG. 1I shows the n-type well 15 and p-type well 16 and the isolation area 17.

The substrate is a p-type crystalline silicon 1 having (100) direction and 2–20 $\Omega$cm resistivity. By the conventional method, the twin buried layer 2,3 are formed on the substrate 1. And the single crystalline silicon epitaxial layer 4 of thickness 2 $\mu$m is grown on the twin buried layer 2,3 shown in FIG. 1B.

Then the oxide film layer 5 is formed with thickness 380 Å on the overall surface of the epitaxial layer 4 and the nitride film layer 6 of Si3N4 is coated with thickness 1000 Å on said oxide film layer 5 by conventional LPCVD method. The masking layer consisting of said oxide film layer 5 and said nitride film layer 6 is used to prevent the surface of lower epitaxial layer 4 from oxidizing and implanting impurities thereto during oxidation process.

The nitride film layer 6 and oxide film layer 5 on which n-type well region is formed as shown in FIG. 1D. and the silicon substrate 8 with the depth of 0.5 $\mu$m on the lower part of the oxide film layer 5 is selectively removed. At this time the nitride film layer 6, oxide film layer 5 and silicon substrate 8 are removed in turn by using photosensitive materials 7 and conventional photolithographic method in order to make n-type well region in which impurities of the column V atoms such as phosphorus is ion-implanted with the energy of 180 KeV and the dose of $10^{11}$ to $^{13}$ ions/cm$^2$ to remove the photosensitive materials 7.

And then the oxide film layer 9 of 4.000 Å is formed on the upper part of n-type well region through the processing of localized oxidation of silicon as shown in FIG. 1E. This time the impurities of column V atoms such as phosphorus injected in said n-type well region are activated in the activation region 10 and said oxide film layer 9 plays a role of preventing the impurities of column III atoms such as boron from injecting into the p-type well region when said impurities are injected into the next p-type well region.

Then the nitride film layer 6 is etched to make the condition as shown in FIG. 1.F. on which the impurities of column III atoms are ion-implanted with the energy of 60 KeV and the dose of about $3 \times 10^{11}$ to $^{13}$ ions/cm$^2$ on the lower part of p-type well region and then the oxide film layer 5, 9 of the whole upper silicon substrate 4 is removed as shown in FIG. G. using conventional etching method.

Then, after the oxide film layer 11 with the thickness of 380 Å is formed on the whole surface of substrate 4 upon which nitride film layer 12 of Si3N4 with the thickness of 1.500 Å is formed by the conventional LPCVD method, photosensitive materials 13 is used to remove the rest of the nitride film except for the nitride film layer 12 of both the regions 100, 101, 102 on which device is formed and the well contacting region 103, 104, 105 in order to form the condition as shown in FIG. 1.H. by etching the nitride film layer through photolithography processing.

Figure 2:
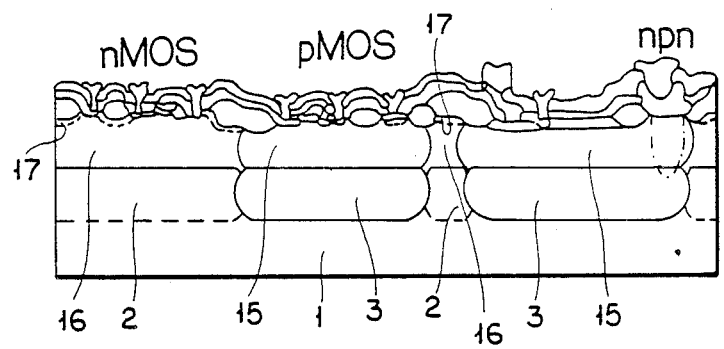
FIG. 2 is a cross-sectional view of a semiconductor device according to the present invention.

And for the electrical isolation among devices, the impurities of the column III atoms such as boron are ion-implanted with the energy of 30 KeV and the dose of $5 \times 10$ ions/cm in a confined region to remove the photosensitive materials 13 and the device isolation oxide film 14 is formed to the thickness of 5,500 Å by the conventional thermal treatment as shown in FIG. 1J. In that oxidation process, the oxide film is grown onto not the lower silicon substrate of the oxide film layer 11 and nitride film layer 12 of masking layer but the region of silicon substrate without coating of masking layer 12. At the same time, for the electrical isolation between said p-type well region and devices the impurities of column III atoms such as boron injected in a confined region and the impurities of column V atoms such as phosphorus of said n-type well region are activated to form n-type well 15, p-type well 16 and the isolation region 17 of devices. And then biopolar, n-MOS, p-MOS transistors are formed by the conventional method in a semiconductor device as shown in FIG. 2.

Consequently, the very thin epitaxial layer can be formed for forming high speed bipolar transistor, besides, when the nMOS transistor is formed, the grown-up thickness of epitaxial layer is kept the same, so that it has much beneficial effect in the case of integrating various devices on one chip.

As described at the above, the present invention can be expected to solve the problem of controlling that when various devices are to be formed on same chip, the thickness of silicon epitaxial layer formed on silicon substrate would be changed by the characteristic of each of devices. Especially, in fabricating the high speed bipolar transistor and high performance CMOS transistor on same chip, high efficiency and high integration can be easily attained by reducing the difficulty in processing.

The invention is in no way limited to the embodiment described hereinabove. Various modifications of disclosed embodiments as well as other embodiments of the invention will become apparent to persons skilled in the art referance to the description of the invention. It is therefore comtemplated that the appended claims will cover any such modifications or embodiments as fall within the true scope of the invention.

What is claim is:

1. A method for fabricating a semiconductor device comprising the steps of:
    forming buried layers on the silicon substrate;
    etching an epitaxial after said layer is grown, the step further including the processes of etching selectively the silicon epitaxial layer of well region on which a high speed bipolar transistor is formed to be thin and keeping the silicon epitaxial layer of well region on which nMOS transistor is formed the same thickness as grown; and
    forming a pMOS transistor, a nMOS transistor and a bipolar transistor.

2. A method according to claim 1, wherein the p-type well region 16 is implanted with column III impurities through the nitride mask opening and the n-type well region 15 is defined by the oxide layer 9 etching after the p-type well 16 formation.

* * * * *